United States Patent [19]

Boada Fonts

[11] Patent Number: 5,801,925
[45] Date of Patent: Sep. 1, 1998

[54] ELECTRONIC INTEGRATION IN SERVICE BOXES

[75] Inventor: Joan M. Boada Fonts, Valls, Spain

[73] Assignee: UT Automotive Dearborn, Inc., Dearborn, Mich.

[21] Appl. No.: 693,731

[22] Filed: Aug. 7, 1996

[30] Foreign Application Priority Data

Aug. 7, 1995 [ES] Spain ........................... 9501610

[51] Int. Cl.⁶ ........................................... H05K 5/00
[52] U.S. Cl. ........................ 361/752; 361/791; 361/790; 361/803
[58] Field of Search .............................. 361/784, 796, 361/752, 791, 789, 790, 803; 439/89, 76.2, 45, 69, 75

[56] References Cited

U.S. PATENT DOCUMENTS

| | | | |
|---|---|---|---|
| 4,689,718 | 8/1987 | Maue et al. | 361/686 |
| 4,869,975 | 9/1989 | Ogawa | 439/76.2 |
| 4,944,684 | 7/1990 | Leibowitz | 439/76.2 |
| 5,040,097 | 8/1991 | Stribel | 439/76.2 |
| 5,478,244 | 12/1995 | Maue et al. | 439/76.2 |

*Primary Examiner*—Kristine L. Kincaid
*Assistant Examiner*—Anthony Dinkins
*Attorney, Agent, or Firm*—Howard & Howard

[57] ABSTRACT

An automotive junction box for controlling the flow of power and control signals throughout the interior of an automobile having controllable features. The junction box includes a housing and a first printed circuit board disposed within the housing. The first printed circuit board having a plurality of first conductive elements with a first thickness for carrying power from and through the housing. The first printed circuit board further having a plurality of second conductive elements with a second thickness for relaying control signals from the housing for actuating the features. The junction box further includes componentry attaching to the board and/or the conductive elements. As a result of using these two conducting element thicknesses, the junction box operates as an electrical distribution center and a center for electronic functions.

17 Claims, 4 Drawing Sheets

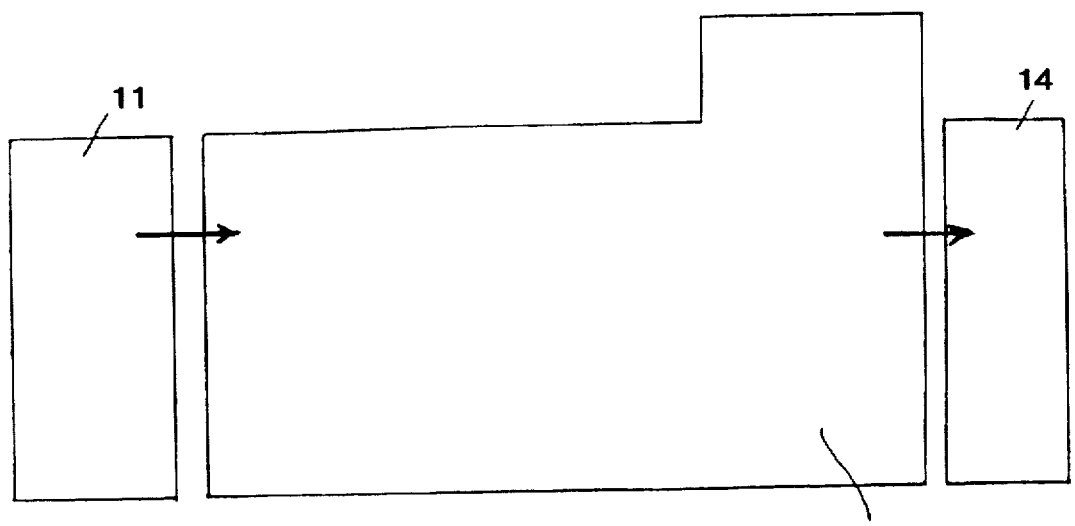
FIG. 3
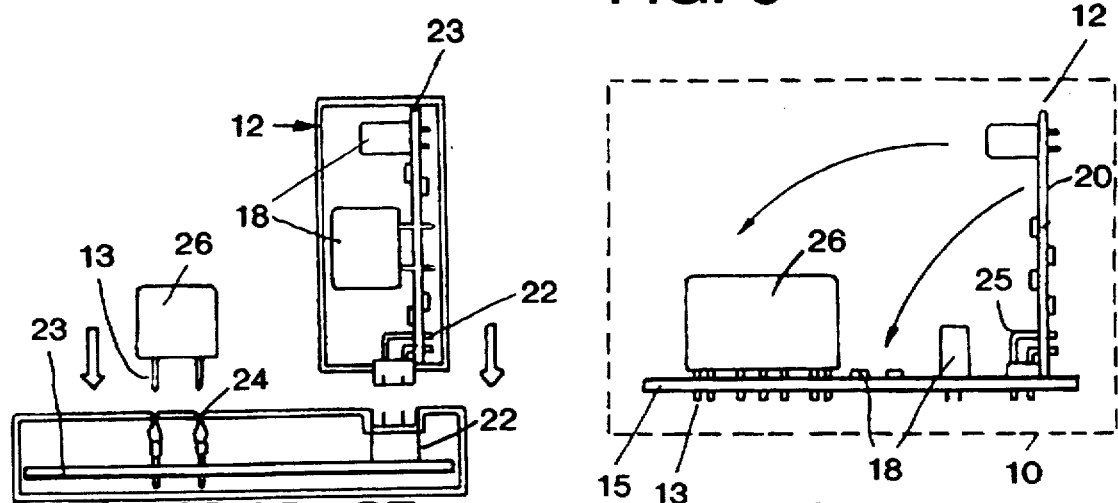
PRIOR ART
FIG. 4
FIG. 5
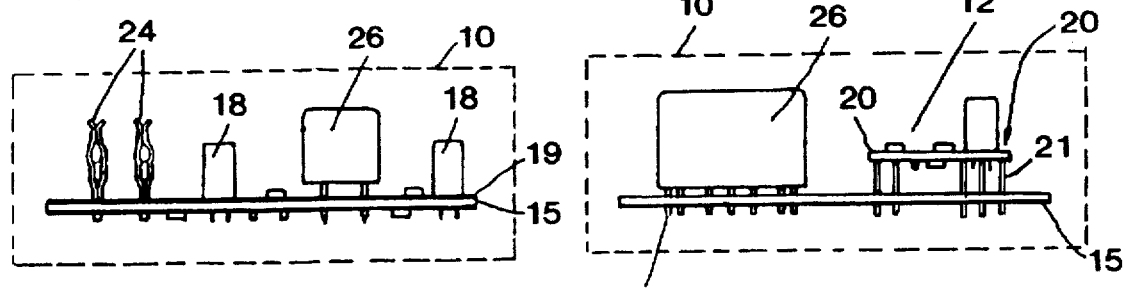
FIG. 6
PRIOR ART
FIG. 7

1

ELECTRONIC INTEGRATION IN SERVICE BOXES

TECHNICAL FIELD

The present invention relates to electronic integration in service boxes, and more particularly to integrated service boxes with new characteristics of construction, conformation and design.

BACKGROUND OF THE INVENTION

Conventional service boxes are devices for centralizing the connections of the electrical system of automobiles. As such, service boxes provide support for interconnections of various power lines, as well as for various components, such as relays, electronic modules and connectors. Prior to this centralization such connections were distributed totally or partially, at various points of the automobile. Due to known construction procedures for service boxes uniting connections at a single location facilitates not only the construction of an important part of the electrical system of the automobile, but also assures easy location of faults and rapid repair of the same at a single place when necessary. Despite the above, various distinct electronic parts continued to exist within the automobile. These electronic parts control the operation of parts added to the automobile and facilitate driving. Therefore an improved service box is sought, which integrates these electronic or module functions within the service box.

SUMMARY OF THE INVENTION

According to one embodiment of the present invention a junction box includes a housing and a first printed circuit board disposed within the housing. The first printed circuit board includes a plurality of first conductive elements with a first thickness and a plurality of second conductive elements with a second thickness. The thickness of the first conductive elements allows power to be carried from and through the housing for powering the features within an automobile. The thickness of the second conductive elements allows control signals to be relayed from the housing for actuating the features.

The foregoing invention will become more apparent in the following detailed description of the best mode for carrying out the invention and in the accompanying drawings.

BRIEF DESCRIPTION OF THE DRAWINGS

FIG. 3 is a schematic view of total integration with the service box.

FIG. 4 is a front view of a prior art service box.

FIG. 5 is a front view of a prior art service box.

FIG. 6 is a front view of a service box of the present invention.

FIGS. 7–14 are front views of various embodiments of the service box of the present invention.

BEST MODE FOR CARRYING OUT AN EMBODIMENT OF THE INVENTION

Figure 1:
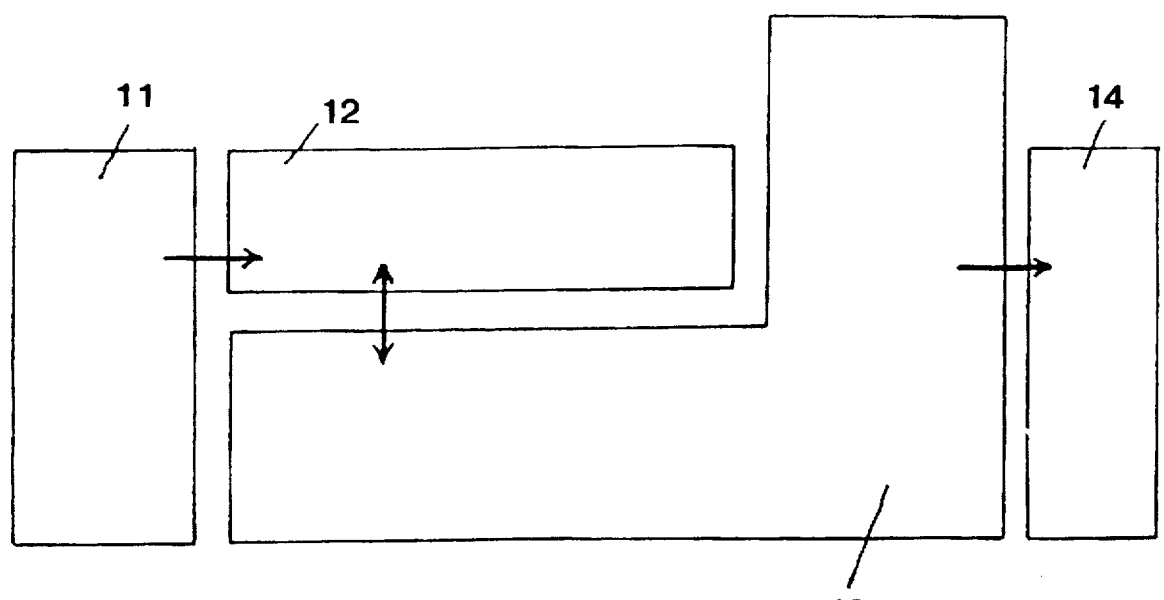
FIG. 1 is a schematic view of a first level of integration with a service box of the present invention.

Referring to FIG. 1, part of an electronic module (12) is integrated with a service box (10) for the purpose of facilitating the number of interconnections. The connection is made in the direction of the arrows. The bank of switches (11) act upon the electronic module (12). A load (14) is connected to the service box (10).

Figure 2:
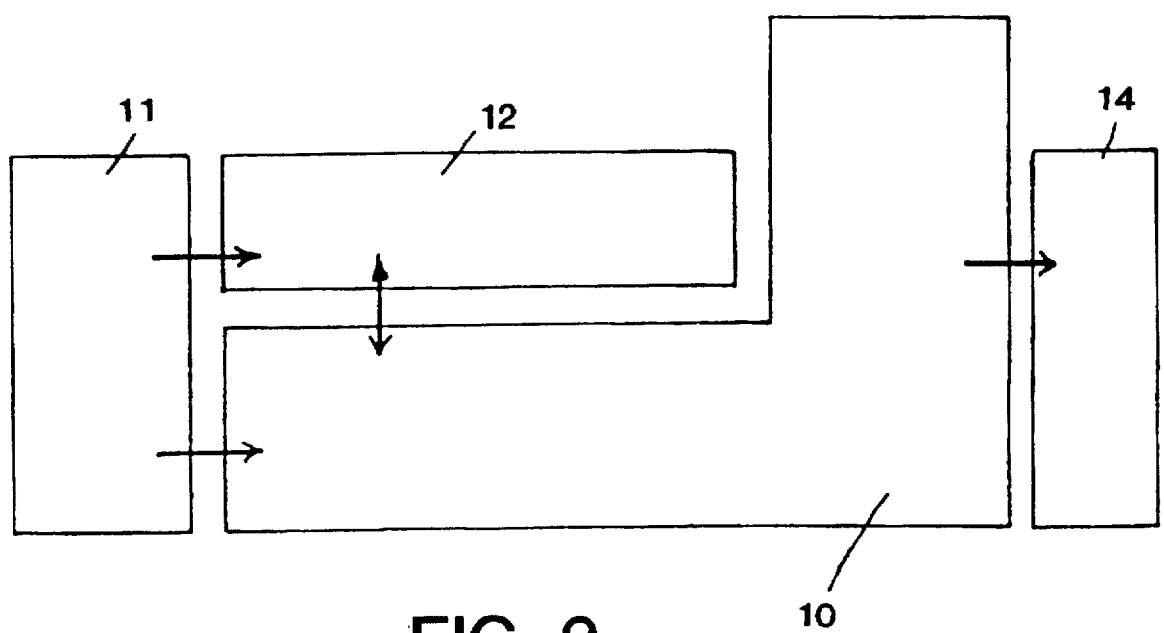
FIG. 2 is a schematic view of a second level of integration with the service box.

Referring to FIG. 2, part of the electronic functions incorporated by the electronic module (12) are integrated with the service box (10) in such a way that the signals from the bank of switches (11) act directly upon the service box (10) and the electronic module (12).

Referring to FIG. 3, the electronic module (12) (as shown in FIGS. 1 and 2) is completely integrated with the service box (10).

Referring to FIG. 4, the prior art service box (10) has the electronic module (12) connected with the help of a connector (22) to a service box (10). The interior of both the electronic module (12) and the service box (10) contain a power printed circuit board (23) into which a plurality of small female sockets (24) have been attached. Conventional relay connections (26) have been inserted into the female sockets (24) by means of the leads (13).

The term "power printed circuit board" (23) means in the specification and the appended claims that the printed circuit board is designed with the capacity to support up to 400 Amps with a conductor-element thickness of up to 400 microns. This enables the power printed circuit board to transmit significant loads into the automobile interior.

Referring to FIG. 5, the electronic module (12) comprising a signal printed circuit board (20) soldered to a 400-micron printed circuit board (15) with the aid of the bent pins (25). The electronic components (18) are also attached to the printed circuit board (15) forming a single unit or service box (10).

The term "signal printed circuit board" (20) means in the specification and the appended claims that the printed circuit board is prepared to support a current intensity of less than 5 Amps, employing a copper conductor-element thickness of from 35 to 105 microns, and specially designed to control relays and automobile electronics in general.

Referring to FIG. 6, the service box (10) includes a mixed printed circuit board (19) which includes 105-micron conductors on one surface and 400-micron conductors on the other. The service box further includes a 400-micron printed circuit board (15). Part of the electronic components (18) are soldered to the mixed printed circuit board (19) and part to the 400-micron printed circuit board (15), as well as the small female sockets (24).

Referring to FIG. 7, the service box (10) is formed by an electronic module (12). The electronic module (12) is formed by a 35-micron printed circuit board (20) integrated with a 400-micron printed circuit board (15), with the aid of the corresponding long pins (21).

Figure 8:
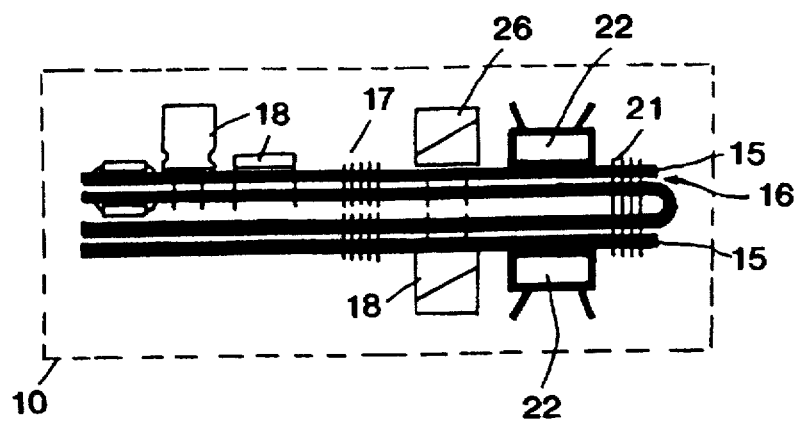

Referring to FIG. 8, the 400-micron printed circuit board (15) includes a double face, and is bent over at one of its ends. Two power printed circuit boards (15) sandwich the bent 400-micron printed circuit board (15). A dielectric support (16) is disposed between the bent 400-micron printed circuit board and the adjacent board. The electronic components (18,22,26) are soldered into all of the printed circuit boards. The outer printed circuit boards may be replaced by mixed or signal printed circuit boards.

Figure 9:
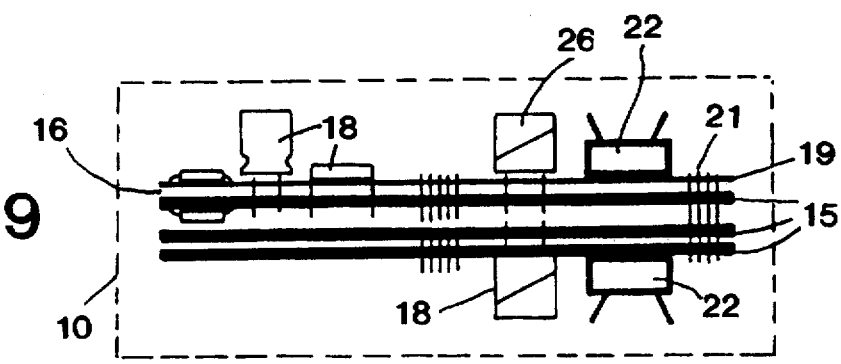

Referring to FIG. 9, a service box (10) includes a 400-micron printed circuit board (15) and a mixed printed circuit board (19). The mixed printed circuit board (19) has copper conductors with different thicknesses. The electronic components (18, 22, 26) are soldered onto the mixed printed circuit board (19).

Figure 10:
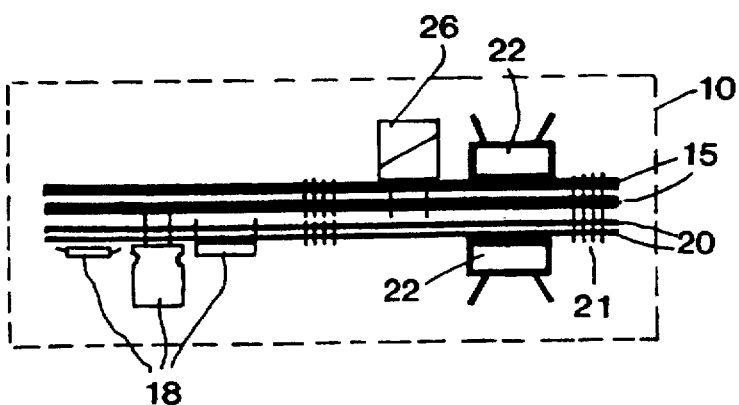

Referring to FIG. 10, the service box (10) includes a 400-micron printed circuit board (15) and a 105-micron, double-sided signal printed circuit board (20). The electronic components (18) are soldered to the signal printed circuit board (20), the signal is transmitted from the signal printed circuit board (20) through the bank of long pins (21) to the 400-micron printed circuit board (15).

Figure 11:
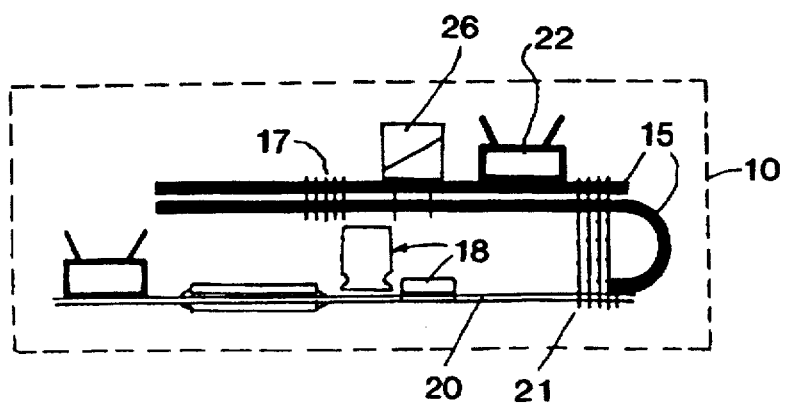

Referring to FIG. 11, the service box (10) includes a 400-micron printed circuit board(15)joined by short, bent pins (17) to a second printed circuit board (15'). The two printed circuit boards (15 and 15') are attached to the signal printed circuit board (20) via long pins (21). The electronic components (18) are connected to the signal printed circuit board (20).

Figure 12:
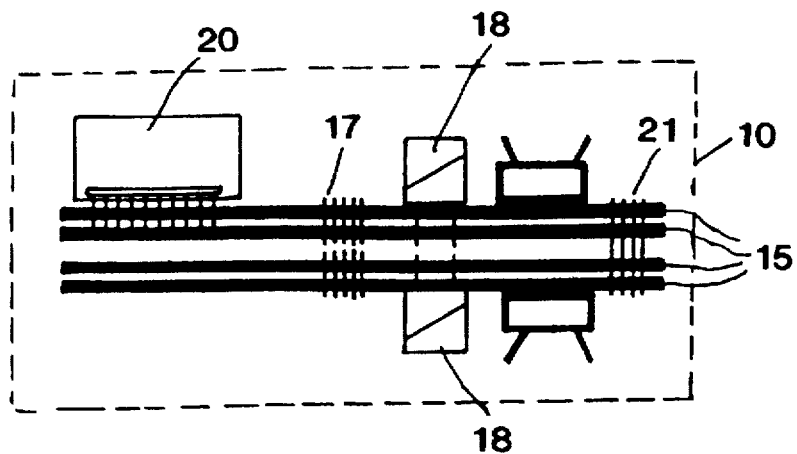
Figure 13:
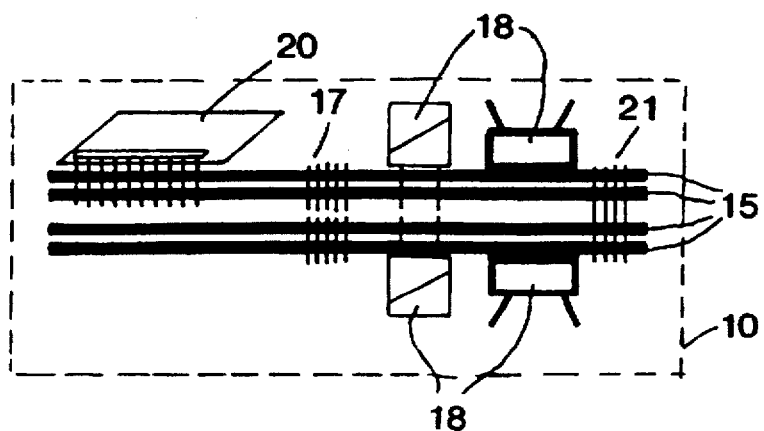
Figure 14:
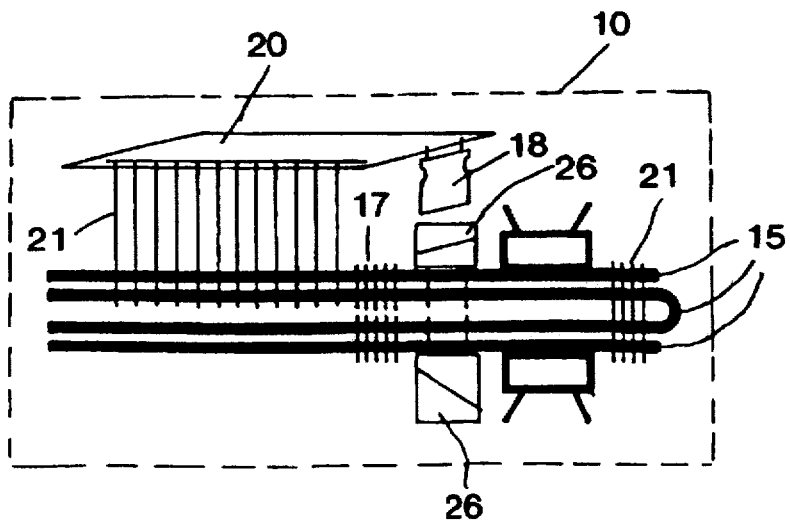

Referring to FIG. 12, the service box (10) includes a 400-micron power printed circuit board (15) soldered into a 35-micron signal printed circuit board (20). The signal printed circuit board (20) controls the power which circulates through the power printed circuit board (15). The signal printed circuit board (20) is positioned perpendicular to the power printed circuit board, so that the signal printed circuit board is in a vertical position using short pins (17) or long pins (21). The electronic components (18) being arranged between the signal printed circuit board (20) and power printed circuit board (15). The signal printed circuit board (20) may also be positioned parallel to the power printed circuit board, so that the signal printed circuit board is in a horizontal position (as shown in FIGS. 13 and 14).

In one of the preferred realizations which is the object of the present invention, as seen in FIGS. 1, 2 and 3, the general system of integration of a signal printed circuit board (15) or module (12) with a power printed circuit board (15) can be implemented by means of different architectures, planned according to the integration of the electronics of the service boxes (10), which can be as shown in FIG. 1, in which it can be seen how the bank of switches (11) is connected via a cable to the electronic module (12) or signal printed circuit board (20), and the same to a power printed circuit board (15) of service box (10), to which all the loads (14) in various parts of the automobile are connected by cables.

A different plan for the same system is the architecture depicted in FIG. 2, in which the bank of switches (11) is connected by cables to an electronic module (12) and to the service box (10), so that the latter is connected via cables to the aggregate of loads distributed in different parts of the automobile.

A different, more advanced integration scheme, which we can consider total integration, appears in FIG. 3. The bank of switches (11) is connected by cables to the service box (10) which is the combination of a signal printed circuit board and a power printed circuit board, which is in turn connected by cables to the aggregate of loads (14) at various different parts of the automobile.

At the first level, the arrangement shown in FIG. 1 corresponds to the integration of various electronic components (18), at present external to the service box (10), which form part of an electronic module (12). These functions consist of the controllers (drivers) of the relays and small load, as well as diagnostic functions, detection through shunts of the failure of flasher lamps, brake lights, turn signals and the integration of the relays of the printed circuit board and solid state relays.

Integrated at the second level of integration as shown in FIG. 2, in addition to the integration of the functions shown in FIG. 1, are those functions considered basic and installed in the majority of vehicles, such as flashers, controllers, glass heaters, front and back wiper controllers, lighting alarm and others.

Finally, as shown in FIG. 3, total integration, also called an intelligent box or junction box, consists of the integration into the service box (10) of all the electronic functions, or a large number of them, which are currently incorporated into various electronics modules (12), connected or not to the present service box (10). These functions are essentially all the operations of the vehicle generally controlled by a microprocessor. For example, flashers, door locks, anti-intrusion alarms, seat heaters, headlight high-beam/low-beam controllers, windshield and rear-view mirrors, thermostats, dome-light controllers, and lamp-failure detection.

The various different versions or forms of mounting a service box (10), shown in the above figures, are all part of the same inventive idea, that is to say, the combination of signal printed circuit boards (20) and of power printed circuit boards, interconnected together, according to the various solutions disclosed, up to the point of achieving total integration. In this way, a plurality of electronic modules dispersed throughout various locations in the automobile are integrated into this service box (10).

The proclaimed integration architectures have the following advantages: less weight than the traditional system, less volume than the traditional system, reduction in the overall system cost, ease of mounting the box on the vehicle, reduction of the number of connectors, reduction in the system cabling, and avoidance of mounting errors by reducing the number of integrated references.

While a particular invention has been described with reference to illustrated embodiments, various modifications of the illustrative embodiments, as well as additional embodiments of the invention, will be apparent to persons skilled in the art upon reference to this description without departing from the spirit and scope of the invention, as recited in the claims appended hereto. It is therefore contemplated that the appended claims will cover any such modification or embodiments that fall within the true scope of the invention.

I claim:

1. An integrated electrical junction box for controlling the flow of both power signals and control signals in a vehicle having a plurality of controllable electronic features, comprising:

a housing; and a first printed circuit board disposed within said housing and having;

a plurality of first conductive elements thereon, each of said first conductive elements having a first thickness, said first conductive elements conducting said power signals and said power signals for powering said features;

a plurality of second conductive elements thereon, each of said second conductive elements having a second thickness, said second conductive elements conducting said control signals and said control signals for actuating said features;

componentry attaching to said board and/or said first or second conductive elements for controlling said flow of said power signals and said control signals; and said first thickness being greater than said second thickness.

2. The junction box of claim 1, wherein said first thickness is up to 400 microns and said second thickness is between 35 to 105 microns.

3. The junction box of claim 1, wherein said junction box includes a second printed circuit board disposed within said housing having;
- a plurality of third conductive elements thereon, each of said third conductive elements having a third thickness to conduct an additional power signal from and through said housing, said power signal for powering said features; and
- componentry attaching to said second printed circuit board and/or said third conductive elements for controlling said flow of said power signals and said control signals.

4. The junction box of claim 3, wherein said third thickness is up to 400 microns.

5. An integrated electrical junction box for controlling the flow of both power signals and control signals in a vehicle having a plurality of controllable electronic features, comprising:
- a housing;
- a first printed circuit board disposed within said housing having;
  - a plurality of first conductive elements thereon, each of said first conductive elements having a first thickness, said first conductive elements conducting said power signals and said power signals for powering said features;
- a second printed circuit board disposed within said housing having:
  - a plurality of second conductive elements thereon being connected to said first conductive elements using long pins, each of said second conductive elements having a second thickness, said second conductive elements conducting said control signals and said control signals for actuating said features; said second thickness being up to 400 microns and greater than said first thickness; and
- componentry attaching to said first and second printed circuit boards and/or said first or second conductive elements for controlling said flow of said power signals and said control signals.

6. The junction box of claim 5, wherein the first thickness is between 35 microns to 105 microns.

7. A junction box for controlling the flow of power and control signals throughout a vehicle having controllable features, comprising:
- a housing;
- a first printed circuit board disposed within said housing having;
  - a plurality of first upper conductive elements on the upper surface of said first printed circuit board, each of said first upper conductive elements having a first upper thickness;
  - a plurality of first lower conductive elements on the lower surface of said first printed circuit board, each of said first lower conductive elements having a first lower thickness;
- a second printed circuit board disposed within said housing having;
  - a plurality of second upper conductive elements on the upper surface of said second printed circuit board, each of said second upper conductive elements having a second upper thickness;
  - a plurality of second lower conductive elements on the lower surface of said second printed circuit board, each of said second lower conductive elements having a second lower thickness;
- a third printed circuit board disposed within said housing between said first and said second printed circuit boards having;
  - a plurality of third upper conductive elements on the upper surface of said third printed circuit board, each of said third upper conductive elements having a third upper thickness;
  - a plurality of third lower conductive elements on the lower surface of said third printed circuit board, each of said third lower conductive elements having a third lower thickness; said first conductive elements, said second conductive elements, and said third conductive elements being coupled by pins; and
- componentry attaching to said first, second, and third printed circuit boards and/or said first or second or third conductive elements for controlling said flow of said power and control signals.

8. The junction box of claim 7, wherein the first upper thickness is between 35 microns to 105 microns and said first lower thickness is up to 400 microns, and the second upper thickness is between 35 microns to 105 microns and said second lower thickness is up to 400 microns, and said third thickness is up to 400 microns.

9. The junction box of claim 8, wherein the third printed circuit board is bent at one end.

10. The junction box of claim 7, wherein the first upper and lower thicknesses are up to 400 microns, and the second upper and lower thicknesses are between 35 microns to 105 microns, and said third thickness is up to 400 microns.

11. The junction box of claim 10, wherein the third printed circuit board is bent at one end.

12. The junction box of claim 7, wherein the junction box further includes a fourth printed circuit board disposed within said housing between said third and said second printed circuit boards having;
- a plurality of fourth upper conductive elements on the upper surface of said fourth printed circuit board, each of said fourth upper conductive elements having a fourth upper thickness;
- a plurality of fourth lower conductive elements on the lower surface of said fourth printed circuit board, each of said fourth lower conductive elements having a fourth lower thickness; said first conductive elements, said second conductive elements, said third conductive elements, and said fourth conductive elements being coupled by pins; and componentry attaching to said first, second, third, and fourth printed circuit boards and/or at least one of said conductive elements for controlling said flow of said power and control signals.

13. The junction box of claim 12, wherein the first upper thickness is between 35 microns to 105 microns, and said first lower thickness is up to 400 microns, and said second thicknesses are 400 microns, said third thicknesses are 400 microns, and said fourth thicknesses are 400 microns.

14. The junction box of claim 12, wherein the first thicknesses are up to 400 microns, said second thicknesses are 400 microns, said third thicknesses are between 35 microns to 105 microns, and said fourth thicknesses are between 35 microns to 105 microns.

15. The junction box of claim 12, wherein the junction box further comprises a fifth printed circuit board disposed within said housing coupled to the upper surface of the first printed circuit board having;
- a plurality of fifth conductive elements on the surfaces of said fifth printed circuit board, each of said fifth conductive elements having a fifth thickness; said fifth thickness being between 35 microns to 105 microns; said componentry attaching to said fifth printed circuit board and/or said fifth conductive elements for controlling said flow of said power and control signals.

16. The junction box of claim 15, wherein said fifth printed circuit board is positioned substantially parallel to said first printed circuit board.

17. The junction box of claim 15, wherein said fifth printed circuit board is positioned substantially perpendicular to said first printed circuit board.

* * * * *